(12) United States Patent
Huang et al.

(10) Patent No.: US 8,235,002 B2
(45) Date of Patent: Aug. 7, 2012

(54) PLASMA ASSISTED APPARATUS FOR ORGANIC FILM DEPOSITION

(75) Inventors: Guo-Shing Huang, Tainan (TW); Tung-Ying Lin, Kaohsiung (TW); Chun-Hao Chang, Kaohsiung County (TW); Herrison Wang, Tainan County (TW); Teng-Yen Wabg, Yunlin County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 612 days.

(21) Appl. No.: 12/046,042

(22) Filed: Mar. 11, 2008

(65) Prior Publication Data

US 2009/0133622 A1 May 28, 2009

(30) Foreign Application Priority Data

Nov. 23, 2007 (TW) ................................ 96144382 A

(51) Int. Cl.
*C23C 16/00* (2006.01)
(52) U.S. Cl. .................................... 118/723 R; 118/663
(58) Field of Classification Search .............. 118/723 R, 118/663
See application file for complete search history.

(56) References Cited

U.S. PATENT DOCUMENTS

| | | | |
|---|---|---|---|
| 4,913,929 A * | 4/1990 | Moslehi et al. ............... 427/564 |
| 5,622,898 A * | 4/1997 | Zechman ...................... 438/127 |
| 5,958,510 A | 9/1999 | Sivaramakrishnam et al. |
| 6,086,679 A * | 7/2000 | Lee et al. ...................... 118/724 |
| 6,143,081 A * | 11/2000 | Shinriki et al. ............... 118/719 |
| 6,291,938 B1 * | 9/2001 | Jewett et al. ............. 315/111.51 |
| 6,302,965 B1 * | 10/2001 | Umotoy et al. ............... 118/715 |
| 6,450,117 B1 * | 9/2002 | Murugesh et al. ..... 118/723 ME |
| 7,722,719 B2 * | 5/2010 | Lei et al. ...................... 118/715 |
| 2005/0000435 A1 | 1/2005 | Lee et al. |
| 2006/0175304 A1 * | 8/2006 | Hwang et al. ............ 219/121.43 |

FOREIGN PATENT DOCUMENTS

TW    550117    9/2003

OTHER PUBLICATIONS

Taiwan Intellectual Property Office, "Office Action", Jul. 29, 2011, Taiwan.

* cited by examiner

*Primary Examiner* — Keath Chen
(74) *Attorney, Agent, or Firm* — WPAT, PC; Justin King

(57) ABSTRACT

A plasma assisted apparatus for organic film deposition, comprising: a plasma chamber, capable of thermally cracking a precursor in the plasma chamber; and a deposition chamber, being channeled with the plasma chamber for receiving the thermally cracked precursor. In an exemplary embodiment, the deposition chamber further comprises a substrate device, being provided for the thermally cracked precursor to deposit thereon to form an organic film. As the plasma chamber is separated from the deposition chamber in the aforesaid apparatus, a low-temperature film deposition process can be used for forming organic films while preventing the substrate device from being bombarded directly by plasma. In addition, as there is a flow guiding device arranged at the outlet of the plasma chamber, the thermally cracked precursor is guided or disturbed and thus is prevented from overly concentrating at the outlet or the center of the substrate device. Thereby, surface roughness as well as uniformity of the organic film can be effectively improved.

15 Claims, 4 Drawing Sheets

«PLASMA ASSISTED APPARATUS FOR ORGANIC FILM DEPOSITION»

BACKGROUND OF THE INVENTION

1. Field of the Invention

The present invention generally relates to a plasma assisted apparatus for organic film deposition and, more particularly, to a plasma assisted apparatus capable of forming organic films at low temperatures using a plasma chamber and a deposition chamber being separated to prevent the substrate form being bombarded by plasma.

2. Description of the Prior Art

The organic light-emitting diode (OLED) display panel has a short lifetime because the organic layer tends to absorbing moisture in the air. As a result, the OLED device is not as competitive as the LCD device in the market. It is known that the lifetime of the OLED device can be prolonged by using a polymeric organic thin film with an inorganic thin film to prevent moisture from entering the OLED device.

Parylene can be used to form a pin-hole free film to exhibit excellent moisture resistance, colorlessness, high transparency, high dielectric strength, high resistance to rust, erosion and weathering. A parylene film is formed by vaporizing (at 150° C.) and cracking (at 650° C.) parylene powders and introducing the cracked products into a deposition chamber to perform chemical vapor-phase deposition (CVD) on the substrate surface at room temperature. However, this leads to non-uniformity and roughness on the thin film surface.

In U.S. Patent Publication No. 20050000435 "Reactor for producing reactive intermediates for low dielectric constant polymer films" and U.S. Pat. No. 5,958,510 "Method and apparatus for forming a thin polymer layer on an integrated circuit structure", cracking is performed outside the deposition chamber and the chemical bonding is broken by plasma inside the deposition chamber to form low-dielectric organic films at a higher deposition rate. The organic films grown by such a method exhibit improved thermal mechanics characteristics but poor uniformity as well as roughness. It is also noted that plasma assisted deposition is performed on the substrate surface inside the deposition chamber. Therefore, the deposition temperature is high and the grown organic film has unreliable film quality and a short lifetime because the substrate is directly bombarded by plasma particles.

SUMMARY OF THE INVENTION

It is an object of the present invention to provide to a plasma assisted apparatus capable of forming organic films at low temperatures using a plasma chamber and a deposition chamber being separated to prevent the substrate form being bombarded by plasma. Thereby, surface roughness as well as uniformity of the organic film can be effectively improved.

In order to achieve the foregoing object, the present invention provides a plasma assisted apparatus for organic film deposition, comprising:

a plasma chamber, capable of thermally cracking a precursor in the plasma chamber; and a deposition chamber, being channeled with the plasma chamber for receiving the thermally cracked precursor;

wherein the deposition chamber further comprises a substrate device, being provided for the thermally cracked precursor to deposit thereon to form an organic film.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention can be exemplified but not restricted by the preferred embodiments as described hereinafter.

Figure 1:
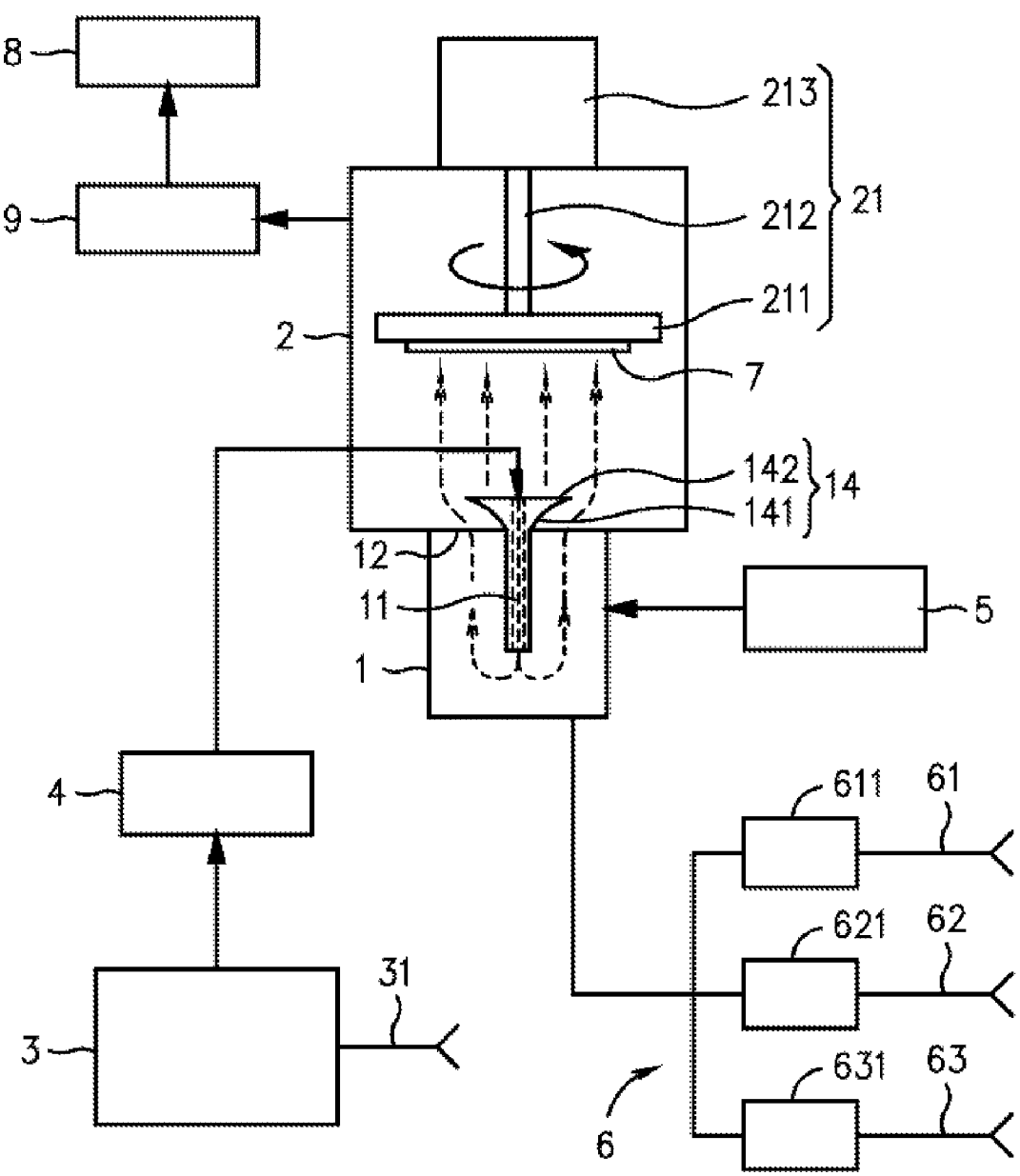
FIG. 1 is a schematic diagram showing a plasma assisted apparatus for organic film deposition according to one embodiment of the present invention.

Please refer to FIG. 1, which is a schematic diagram showing a plasma assisted apparatus for organic film deposition according to one embodiment of the present invention. The plasma assisted apparatus comprises a plasma chamber 1 and a deposition chamber 2.

In FIG. 1, the plasma chamber 1 is channeled with an evaporation chamber 3. The evaporation chamber 3 comprises an inlet pipe 31, through which argon is input to carry vaporized parylene, paraxylylene or poly(p-xylylene) (PPX) from the evaporation chamber 3 into the plasma chamber 1. Generally, the operation temperature inside the evaporation chamber is within a range from 130 to 170 degrees Celsius. A mass flow rate controller 4 is disposed between the evaporation chamber 3 and the plasma chamber 1 to control the flow rate of the precursor evaporated by the evaporation chamber 3 into the plasma chamber 1.

The plasma chamber 1 comprises a gas inletting device 11 and an outlet 12. The gas inletting device 11 is disposed at the bottom center of a flow guiding device 14. The plasma chamber 1 is channeled with the outlet 12 through the gas inletting device 11. Moreover, the plasma chamber 1 is channeled with a RF generator 5 and a working gas inletting device 6. The RF generator 5 provides power for the gas in the working gas inletting device 6 to generate plasma in the plasma chamber 1. The RF generator 5 provides power for the inductively coupled plasma (ICP) source to generate plasma. The plasma region includes the gas inletting device 11. As shown in FIG. 1, the working gas inletting device 6 comprises three inlet pipes 61, 62, and 63, each connected to a flow rate controller 611, 621, 631, respectively, to introduce working gas comprises argon, oxygen and nitrogen. The flow rate of the working gas is controlled by the flow rate controller 611, 621, 631, respectively. When the precursor is vaporized by the evaporation chamber 3, the vaporized precursor is carried by the argon in the inlet pipe 31, controlled by the mass flow rate controller 4 and introduced into the gas inletting device 11. The precursor is cracked at the high temperature due to plasma bombardment in the gas inletting device 11. The precursor is further thermally cracked in the plasma chamber 1.

The deposition chamber 2 is disposed above the plasma chamber 1 and channeled with the plasma chamber 1 for receiving the thermally cracked precursor. The deposition chamber 2 further comprises a substrate device 21, which comprises a supporting portion 211 and a shaft 212. At the bottom portion of the supporting portion 211, a substrate 7 for organic film deposition is disposed. The shaft 212 is connected to a driving motor 213 and is driven by the driving motor 213 to rotate the substrate 7. Then, the thermally cracked precursor is carried onto the surface of the substrate 7 and is deposited to form an organic film. It is noted that the supporting portion 211 is not restricted to the present embodiment, as long as it enables the substrate 7 to be disposed at the bottom portion. The rotating device comprising the shaft 212 and the driving motor 213 is designed in an attempt to drive the supporting portion 211 to rotate the substrate 7. Therefore, the shaft 212 and the driving motor 213 can be substituted by other elements. For example, the driving motor 213 can be replaced by a caterpillar band, a belt or a gear wheel; and the shaft 212 can be replaced by a corresponding caterpillar band wheel, a belt wheel or a gear wheel. Those with ordinary skills in the art can make modification without departing from the spirits of the present invention.

The deposition chamber 2 is further channeled with a pump 8 capable of pumping gas out of the deposition chamber 2 and the plasma chamber 1 and accelerating the thermally cracked precursor to arrive into the deposition chamber 2 from the plasma chamber 1. Furthermore, a cooling chuck 9 is disposed between the pump 8 and the deposition chamber 2 to trap residual precursor in the deposition chamber 2. In the present embodiment, the cooling chuck 9 is a cold trap filled with low temperature liquid nitrogen.

Using the aforesaid apparatus, the present invention provides a method for organic film deposition, comprising two steps described hereinafter:

Step 1: The gas inletting device 11 is bombarded by plasma. The precursor is introduced into the plasma chamber 1 for thermal-cracking. The gas inletting device 11 is heated up by plasma up to 600~900 degrees Celsius for cracking. The bonding of the thermally cracked precursor is broken by particles and electrons in the plasma and is then introduced into the deposition chamber 2.

Step 2: The thermally cracked precursor is introduced onto the substrate 7 to be deposited to form an organic film. Since the plasma chamber 1 and the deposition chamber 2 are separated, the organic film deposition process and the thermal-cracking process are not performed at the same place. Therefore, the operation temperature in the deposition chamber 2 can be controlled between 80 to 100 degrees Celsius, which is suitable for organic film deposition. Meanwhile, the substrate 7 can be prevented from being bombarded by the plasma particles. The substrate device 21 is rotatable to improve surface roughness and uniformity.

More particularly, surface roughness and uniformity can be improved by controlling the uniformity of the precursor from the outlet 12 of the plasma chamber 1. As shown in FIG. 1, a flow guiding device 14 is disposed at the outlet 12 of the plasma chamber 1. The gas inletting device 11 is disposed under the flow guiding device 14. The flow guiding device 14 is a cone-shaped device having an expanding end 142 toward the deposition chamber 2 and a shrinking end 141 toward the plasma chamber 1. When the thermally cracked precursor flows from the outlet 12 through the flow guiding device 14 into the deposition chamber 2, the gas flow angle is adjusted by the expanding end 142 to spread the precursor and avoid the precursor from overly concentrating on the center of the outlet 12. Moreover, the rotatable substrate device 21 improves deposition uniformity. It is noted that the gas inletting device 11 is not restricted to be disposed under the flow guiding device 14, it can be disposed elsewhere, as long as the precursor can enter the plasma chamber 1.

Figure 2:
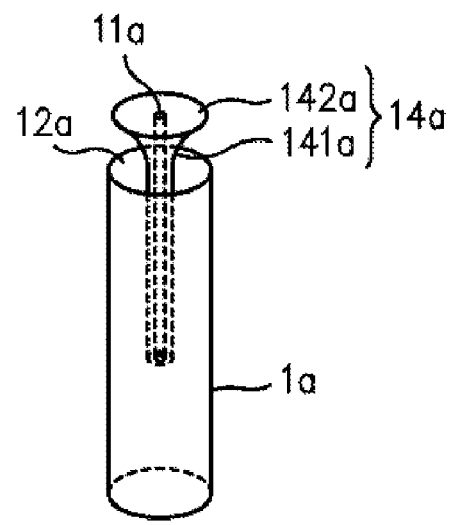
FIG. 2 is a 3-D schematic diagram showing a plasma chamber with a flow guiding device according to one embodiment of the present invention.
Figure 3:
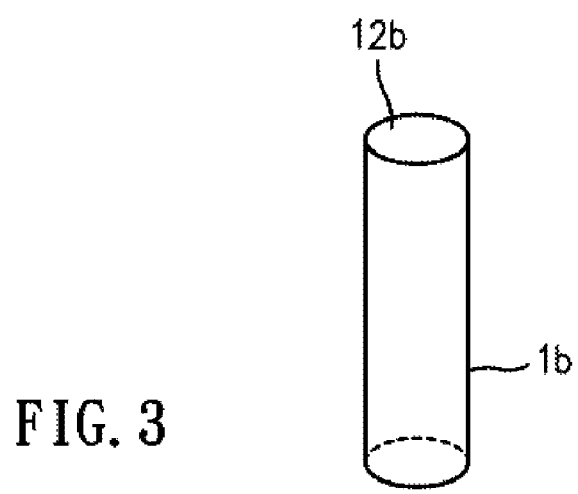
FIG. 3 is a 3-D schematic diagram showing a cylindrical plasma chamber without a flow guiding device according to one embodiment of the present invention.
Figure 4:
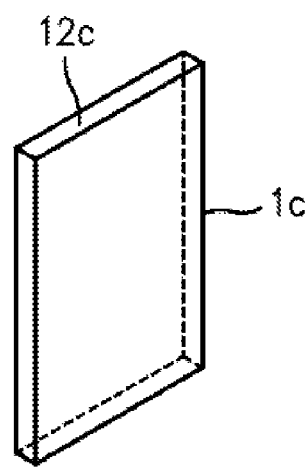
FIG. 4 is a 3-D schematic diagram showing a rectangular plasma chamber without a flow guiding device according to one embodiment of the present invention.
Figure 5:
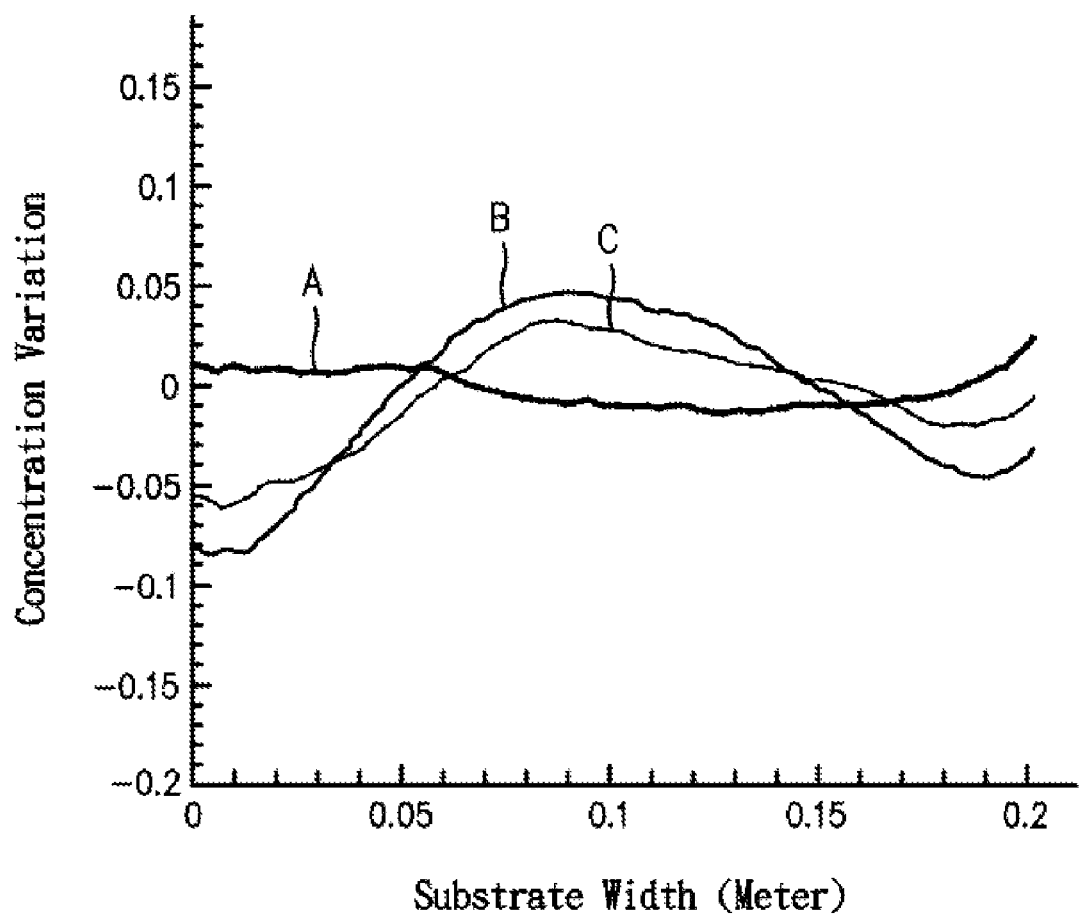
FIG. 5 is a graph showing the concentration variation based on substrate width for outlets of different shapes of the plasma chamber according to one embodiment of the present invention.

Please refer to FIG. 2, which is a 3-D schematic diagram showing a plasma chamber with a flow guiding device according to one embodiment of the present invention. In FIG. 2, the flow guiding device 14a has an expanding end 142a and a shrinking end 141a. The plasma chamber 1a is cylindrical. The flow guiding device 14a is disposed at the outlet 12a. A gas inletting device 11a is disposed under the center portion of the flow guiding device 14a. The gas inletting device 11a is channeled with the plasma chamber 1a and the outlet 12a. Cylindrical plasma is generated in the plasma chamber 1a as shown in FIG. 2. Similarly, in FIG. 3, cylindrical plasma is generated in the plasma chamber 1b, wherein no flow guiding device 14a is disposed. Similarly, in FIG. 4, rectangular plasma is generated in the plasma chamber 1c, wherein no flow guiding device 14a is disposed. The plasma chamber 1b comprises a circular outlet 12b; and the plasma chamber 1c comprises a rectangular outlet 12c. The experimental results show that the plasma generated in the plasma chamber 1a comprising the flow guiding device 14a exhibits more uniform concentration variation, as shown in FIG. 5, wherein curve A is for the plasma chamber 1a comprising the flow guiding device 14a, curve B is for the plasma chamber 1b comprising the circular outlet 12b, and curve C is for the plasma chamber 1c comprising the stripe-shaped outlet 12c. More particularly, curve A shows a more uniform concentration variation within a substrate width of 0.2 meter from the substrate center. Curve B shows that the concentration variation resulted from the circular outlet is larger than the concentration variation resulted from the rectangular outlet represented by curve C. It is noted that the shapes of the outlet and the flow guiding device are not restricted to the present embodiment as long as the flow guiding device is disposed so that the precursor is guided or disturbed and thus is prevented from overly concentrating at the outlet or the center of the substrate.

Figure 6:
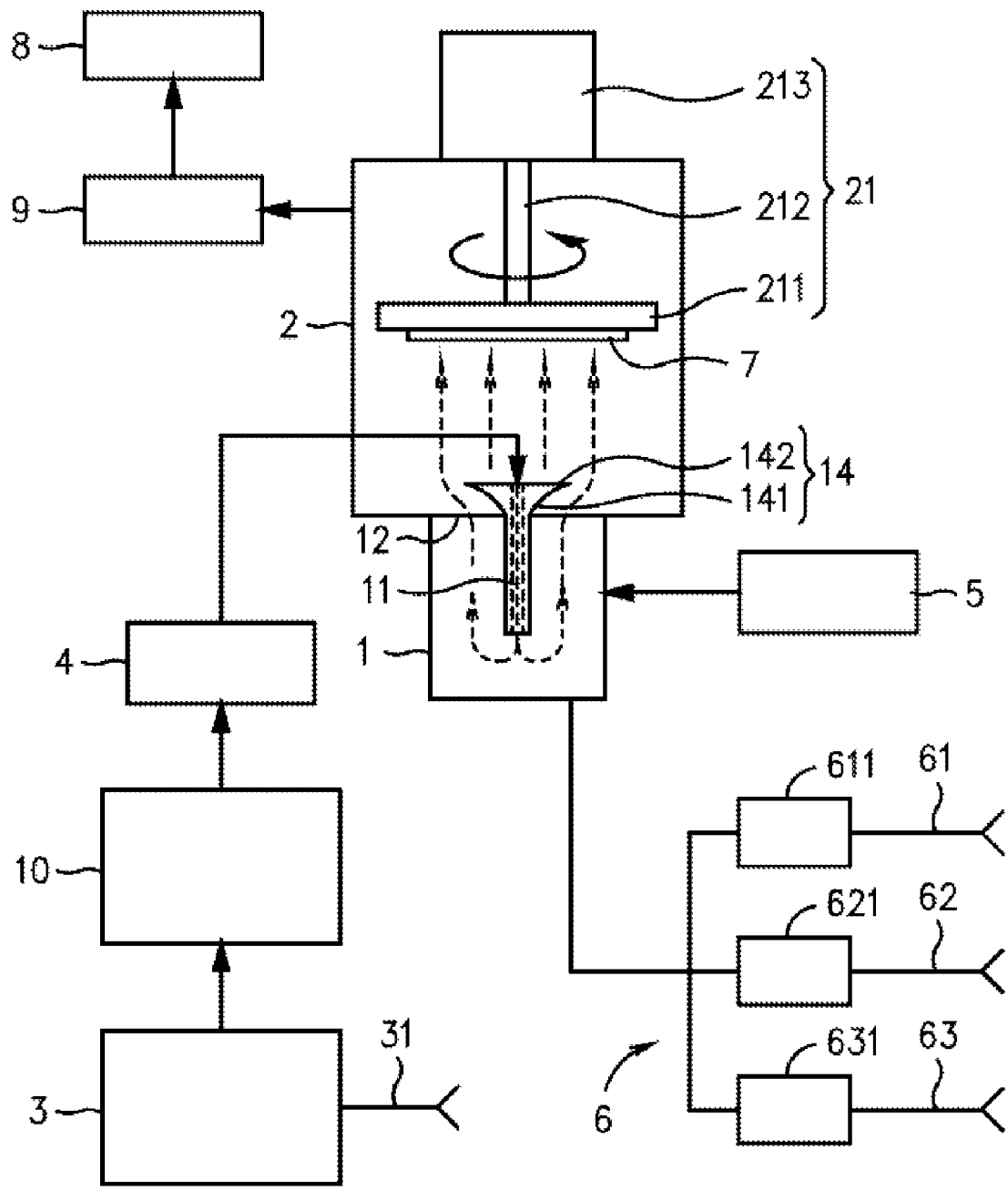
FIG. 6 is a schematic diagram showing a plasma assisted apparatus for organic film deposition according to another embodiment of the present invention.

According to the above discussion, it is apparent that the present invention discloses a plasma assisted apparatus capable of forming organic films at low temperatures using a plasma chamber and a deposition chamber being separated to prevent the substrate form being bombarded by plasma. Thereby, surface roughness as well as uniformity of the organic film can be effectively improved. Moreover, in the present invention, the precursor is thermally cracked using the plasma, and therefore a cracking chamber is not required. However, in order to speed up the cracking process, a cracking chamber can be installed, as shown in FIG. 6. In FIG. 6, a cracking chamber 10 is disposed between the evaporation chamber 3 and the mass flow rate controller 4. The cracking chamber 10 receives the precursor vaporized by evaporation chamber 3 and pre-cracks the precursor so as to speed up the cracking process. For other parts in FIG. 6, they are similar to those with the same structures and functions in FIG. 1 and are thus not repeated.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A plasma assisted apparatus for organic film deposition, comprising:
   a plasma chamber, capable of thermally cracking a precursor in the plasma chamber, comprising:
      an aperture in a wall of the plasma chamber;

an outlet defined within said aperture for the thermally cracked precursor to flow through;

a working gas inlet channeled to a working gas inletting device for introducing working gas into the plasma chamber for thermal cracking;

a flow guiding device disposed at the outlet of the plasma chamber comprising:

a gas inlet device, disposed through the center portion of the flow guiding device, for introducing thermally cracked precursor into the plasma generator;

a shrinking end, environing said gas inlet device and channeled with said plasma chamber, to receive a combination of thermally cracked working gas and precursor from said plasma generator; and an expanding end, environing said gas inlet device, to receive said combination of thermally cracked working gas and precursor from said shrinking end and adjust the gas flow angle of said thermally cracked precursor when leaving said plasma chamber;

wherein said flow guiding device is configured to direct said thermally cracked precursor to enter and flow through said gas inlet device to said plasma generator in a specific direction, and direct said combination of thermally cracked working gas and precursor to enter and flow through the shrinking end of the flow guiding device in the opposite direction to adjust the gas flow angle by said expanding end; and a deposition chamber, being channeled with the plasma chamber for receiving said combination of thermally cracked working gas and precursor via each of said outlet, said aperture, and said flow guiding device, such that said combination of thermally cracked working gas and precursor flows both within the flow guiding device as well as through the outlet of the aperture external to the flow guiding device as the thermally cracked working gas and precursor flows from the plasma chamber into the deposition chamber;

wherein said outlet is defined by the region of said aperture not spatially occupied by said flow guiding device;

wherein the deposition chamber further comprises a substrate device, being provided for the thermally cracked precursor to deposit thereon to form an organic film.

2. The plasma assisted apparatus as recited in claim 1, wherein the plasma chamber is channeled with an evaporation chamber capable of evaporating polymer to form the precursor.

3. The plasma assisted apparatus as recited in claim 2, wherein the operation temperature in the evaporation chamber is within a range from 130 to 170 degrees Celsius.

4. The plasma assisted apparatus as recited in claim 1, wherein the plasma chamber is channeled with a radio-frequency (RF) generator as a plasma source capable of introducing plasma into the plasma chamber.

5. The plasma assisted apparatus as recited in claim 1, wherein the substrate device in the deposition chamber comprises:

a supporting portion, thereon is disposed a substrate for organic film deposition, the substrate being distant from the joint of the plasma chamber and the deposition chamber; and a rotating device, connected to the supporting portion to drive the supporting portion to rotate.

6. The plasma assisted apparatus as recited in claim 5, wherein the rotating device, comprising:

a shaft, connected to the supporting portion; and a driving motor, capable of driving the shaft to rotate.

7. The plasma assisted apparatus as recited in claim 1, wherein the deposition chamber is channeled with a pump capable of pumping gas out of the deposition chamber and the plasma chamber.

8. The plasma assisted apparatus as recited in claim 1, wherein a cooling chuck is disposed between the pump and the deposition chamber to trap residual precursor in the deposition chamber.

9. The plasma assisted apparatus as recited in claim 8, wherein the cooling chuck is a cold trap.

10. The plasma assisted apparatus as recited in claim 1, wherein the precursor comprises parylene, paraxylylene or poly(p-xylylene) (PPX).

11. The plasma assisted apparatus as recited in claim 2, wherein a mass flow rate controller is disposed between the evaporation chamber and the plasma chamber to control the flow rate of the precursor evaporated by the evaporation chamber into the plasma chamber.

12. The plasma assisted apparatus as recited in claim 11, wherein a cracking chamber is disposed between the evaporation chamber and the mass flow rate controller to receive the evaporated precursor for pre-cracking.

13. The plasma assisted apparatus as recited in claim 1, wherein the flow guiding device is a cone-shaped device having said expanding end disposed toward the deposition chamber and said shrinking end disposed toward the plasma chamber.

14. The plasma assisted apparatus as recited in claim 1, wherein the working gas comprises argon (Ar), oxygen ($O_2$) and nitrogen ($N_2$).

15. The plasma assisted apparatus as recited in claim 1, wherein the working gas inletting device is a ceramic pipe.

* * * * *